United States Patent [19]

Ning et al.

[11] 4,288,256

[45] Sep. 8, 1981

[54] METHOD OF MAKING FET CONTAINING STACKED GATES

[75] Inventors: Tak H. Ning, Yorktown Heights; Carlton M. Osburn, Croton-on-Hudson; Hwa N. Yu, Yorktown Heights, all of N.Y.

[73] Assignee: International Business Machines Corporation, Armonk, N.Y.

[21] Appl. No.: 864,074

[22] Filed: Dec. 23, 1977

[51] Int. Cl.³ .................... B01J 17/00; H01L 29/27
[52] U.S. Cl. .................................. 148/1.5; 148/187; 357/23; 357/59; 357/91
[58] Field of Search .................. 148/1.5, 187; 357/23, 357/59, 91

[56] References Cited

U.S. PATENT DOCUMENTS

| | | | |
|---|---|---|---|
| 3,825,945 | 7/1974 | Masuoka | 357/23 |
| 3,868,187 | 2/1975 | Masuoka | 357/23 |
| 3,950,738 | 4/1976 | Hayashi | 340/173 LS |
| 3,967,981 | 7/1976 | Yamazaki | 148/1.5 |
| 3,985,591 | 10/1976 | Arita | 148/187 |
| 3,996,657 | 12/1976 | Simko et al. | 29/571 |
| 4,004,159 | 1/1977 | Rai et al. | 307/238 |
| 4,042,953 | 8/1977 | Hall | 357/71 |
| 4,099,196 | 7/1978 | Simko | 357/23 |
| 4,115,795 | 9/1978 | Masuoka et al. | 357/24 |
| 4,119,995 | 10/1978 | Simko | 357/23 |
| 4,142,926 | 3/1979 | Morgan | 148/187 |

FOREIGN PATENT DOCUMENTS 2445030 4/1976 Fed. Rep. of Germany .
2636350 12/1977 Fed. Rep. of Germany .

OTHER PUBLICATIONS

Scheibe et al., "Technology of . . . . SIMOS", IEEE--Trans. Electron Device, *ED-24*, May 1977, 600.

*Primary Examiner*—L. Dewayne Rutledge
*Assistant Examiner*—Upendra Roy
*Attorney, Agent, or Firm*—Pollock, Vande Sande & Priddy

[57] ABSTRACT

A field effect transistor (FET) comprising a floating gate and a control gate in a stacked relationship with each other and being self-aligned with each other and self-aligned with respect to source and drain regions. The fabrication technique employed comprises delineating both the floating gate and control gate in the same lithographic masking step.

10 Claims, 7 Drawing Figures

4,288,256

METHOD OF MAKING FET CONTAINING STACKED GATES

FIELD OF THE INVENTION

The present invention relates generally to field effect transistors (FETs) and to the preparation of integrated circuits containing arrays of the FETs. More particularly, the present invention relates to FETs which contain a floating gate and a control gate and to the preparation of integrated circuits containing arrays of the FETs. The present invention requires only four basic lithographic (pattern delineating) masking steps to achieve the desired integrated circuit comprising an array of FETs and the associated addressing, decoding, and sensing circuits.

BACKGROUND OF THE INVENTION

In recent years, interest has developed concerning FETs which include a so-called "floating gate" in a stacked arrangement with the control gate. The floating gate differs from a control gate in that it is not electrically connected to any external component and is surrounded by isolation on all sides. Examples of some disclosures of such FETs include U.S. Pat. No. 3,825,945 to Masuoka, U.S. Pat. No. 3,825,946 to Frohman-Bentchkowsky, U.S. Pat. No. 3,836,992 to Abbas et al, U.S. Pat. No. 3,868,187 to Masuoka, U.S. Pat. No. 3,881,180 to Gosney, Jr., U.S. Pat. No. 3,893,151 to Bosselaar et al., U.S. Pat. No. 3,950,738 to Hayashi et al., U.S. Pat. No. 3,984,822 to Simko et al., and U.S. Pat. No. 3,985,591 to Arita.

The presence of the control gate enables the device to function as a regular IGFET, while the floating gate provides a storage space for injected electrons or holes, and thus enables the device to function as an electrically reprogrammable memory device. The floating gate provides a method for changing the threshold voltage needed to pass a charge from the source to the drain. The presence of the control over the floating gate adds control to the injection of charges into the floating gate.

The processes previously suggested for fabricating FETs having a stacked arrangement of a floating gate and a control gate including the patents referred to hereinabove involve the use of at least one additional lithographic masking operation as compared to methods for providing FETs with only one of the gates. The lithographic masking steps involved in preparing integrated circuits are among the most critical. The lithographic masking steps require high precision in registration and extreme care in execution. Each additional lithographic masking step in a process introduces possible surface damage due to mask defects, and increases mask-to-mask registration problems that decrease the processing yield and, accordingly, significantly increase the fabrication cost. Although other factors affect the yield and cost such as, for example, the number of high temperature heat treatments, a basic objective in all FET integrated circuit fabrication is to minimize the number of basic lithographic masking steps required to produce a particular integrated circuit array of desired device structures.

Accordingly, an object of the present invention is to provide a fabrication process for producing integrated circuits of FETs which requires a minimum number of masking steps.

The fabrication of source and drain self-aligned with respect to an FET gate, particularly a polysilicon gate, is well known. In the self-aligned gate technique, a gate (e.g., polysilicon gate) is delineated prior to forming the source and drain regions. The edges of the gate material and the edges of the field isolation serve as a mask for defining the boundaries of the diffused or ion implanted source and drain regions. A method of fabrication for ion implanted self-aligned source and drain regions is described in "Design of Ion-Implanted MOSFET's with Very Small Physical Dimensions" by R. H. Dennard et al., IEEE J. Solid-State Circuits, Vol. SC-9, pp. 256-268 (October 1974). Other disclosures of interest relative to self-aligned techniques include U.S. Pat. No. 3,849,216 to Salters, U.S. Pat. No. 3,895,390 to Meiling et al, U.S. Pat. No. 3,897,282 to White, U.S. Pat. No. 3,946,419 to DeWitt et al, U.S. Pat. No. 3,967,981 to Yamazaki, and U.S. Pat. No. 3,972,756 to Nagase et al. U.S. Pat. No. 3,996,657 to Simko et al suggests a stacked polysilicon gate arrangement wherein a secondary source and drain regions are self-aligned with a floating gate prior to formation of a control gate and formation of primary source and drain regions in alignment with the control gate. U.S. Pat. No. 3,897,282 to White as well as U.S. Pat. No. 3,984,822 to Simko et al suggest stacked polysilicon gate arrangements wherein only the gate closest the semiconductive substrate is self-aligned with the source and drain regions.

Moreover, the article in May, 1977 in IEEE Transactions on Electron Devices, Volume ED-24, No. 5, by A. Scheibe at al entitled "Technology of a New n-Channel One-Transistor EAROM Cell Called SIMOS" seems to suggest a process whereby the control gate and floating gate are self-aligned in the width direction but not in the length direction. The control gate is longer than the floating gate, and therefore, the control gate and floating gate are not completely self-aligned.

The process suggested in this article involves a first masking step to "provisionally" define the floating gate after which an oxide and polysilicon material are deposited. Then a second masking procedure is carried out which defines the control gate and also removes any portions of the floating gate that may exceed the control gate. Next, the source and drain region are formed. The source and drain are self-aligned along the length of the control gate bounded by the field isolation edges. As shown in FIG. 2 of said article, the length dimension of the control gate is longer than the length dimension of the floating gate. In addition to requiring additional masking operations, the process suggested in said article also requires an additional step after the floating gate is provisionally defined to provide insulation on the edges of the floating gate which would have been exposed in the delineation process.

According to the present invention, both the width and length dimensions of the floating gate and control gate are self-aligned with each other and self-aligned with the source and drain regions. The self-alignment according to the present invention is achieved with a minimum number of masking steps. Along with the self-alignment, since the lateral dimensions of the gates are the same, the area occupied by the gates is minimized. This in turn results in reduced overlap capacitance.

SUMMARY OF THE INVENTION

The present invention is concerned with a field effect transistor (FET) which includes a floating gate above which is a control gate. An electrical insulator is positioned between the floating gate and control gate. The floating gate and control gate are self-aligned in both the width and length dimensions (i.e., all of the lateral dimensions) with respect to each other. Source and drain regions are also provided wherein the floating gate and control gate are self-aligned with respect to the source and drain regions in the length dimensions.

The present invention is also directed to a method for fabricating an integrated circuit containing an array of FETs which includes the following steps:

(a) providing a semiconductive substrate of a first conductive type containing active impurities of a first conductive type;

(b) providing and delineating predetermined insulating regions above or recessed into the substrate to provide isolating field regions between FETs of the array;

(c) providing a first insulator for a floating gate to be subsequently defined;

(d) depositing and doping a first layer of polycrystalline silicon or refractory metal or metal silicide above the first insulator;

(e) providing a second and subsequent insulator above said first layer of polycrystalline silicon or refractory metal or metal silicide for a control gate to be subsequently delineated;

(f) then depositing and doping a second and subsequent layer of polycrystalline silicon or metal silicide above said subsequent insulator;

(g) delineating both the first layer of polycrystalline silicon or refractory metal or metal silicide and the subsequent layer of polycrystalline silicon or metal silicide employing the same lithographic mask to provide a floating gate and a control gate, respectively, which are self-aligned with each other in all of the lateral dimensions; and to provide etched regions which are to be subsequently doped for forming the source and drain regions;

(h) thermally diffusing or ion implanting active impurities of a second type into predetermined regions of the semiconductive substrate beneath said etched regions to provide FET source and drain regions which are self-aligned with respect to said floating and control gates in the length dimensions;

(i) providing insulating layer;

(j) delineating contact holes to control gate and to source and drain regions;

(k) depositing and delineating a metallic-type high-conductivity electrical interconnection pattern that makes electrical connection to the control FET gates in the array of FETs and to FET sources and drains.

DESCRIPTION OF PREFERRED EMBODIMENTS

For convenience, the discussion of the fabrication steps is directed to the preferred aspect of employing a p-type silicon substrate as the semiconductive substrate and n-type impurities. This leads to the n-channel FET technology. Accordingly, it is understood that an n-type substrate and p-type diffused or implanted dopant impurities can be employed according to the present invention in the p-channel FET technology.

It is understood that when the discussion refers to n-type impurities, the process steps are applicable to p-type impurities and vice versa. Also, the present invention is applicable to substrates other than silicon which are known in the art. Also, as used herein, the terms "metallic type interconnection lines" or "high-conducitivity interconnection lines" refer to metal lines such as aluminum as well as to nonmetallic materials (e.g., highly doped polysilicon or intermetallic silicides) which nevertheless can have conductivities of the magnitude generally possessed by conductive metals. Moreover, the terms "polysilicon" and "polycrystalline silicon" are used herein interchangeably as in the prior art. Also, when reference is made to impurities of a "first type" and to impurities of the "second type", it is understood that the "first type" refers to the opposite conductivity type. That is, if the "first type" is p, then the "second type" is n. If the "first type" is n, then the "second type" is p.

Also, for convenience, the discussion of the fabrication steps refers to photolithography. However, other lithographic techniques, such as electron-beam systems, can be employed, when desired. Moreover, although the discussion which follows refers to wet chemical etching, it is understood that other etching techniques such as reactive ion etching can be used when desired.

Although the fabrication process is described employing the preferred material, polycrystalline silicon as both the floating gate and control gate, other materials can be employed to provide the floating gate and control gate. In particular, the floating gate can also be fabricated from a refractory metal or silicide thereof and the control gate can be fabricated from a refractory metal silicide. A refractory metal is understood within the context of the present invention to be a metal which can withstand the high temperatures experienced during the fabrication without degrading to an undesired extent. Examples of some suitable refractory metals include tungsten, tantalum, hafnium, and rhodium. Examples of some suitable silicides include tungsten silicide, tantalum silicide, hafnium silicide, and rhodium silicide.

Figure 1:
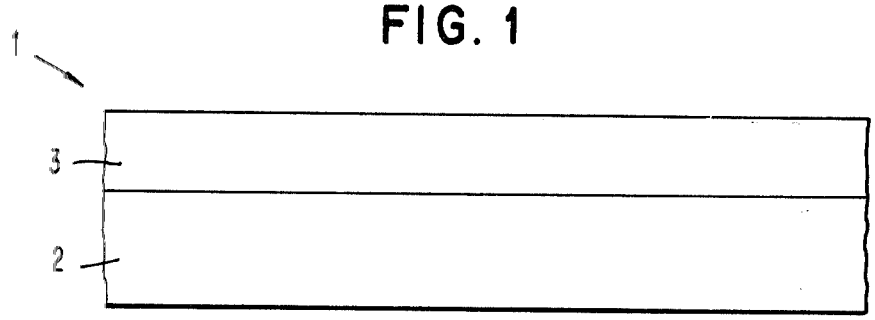
FIGS. 1-6 are elevation side views of an FET in various stages of fabrication.

Referring to FIG. 1, there is shown the initial structure of the invention generally shown as 1. A p-type silicon substrate 2 having any desired crystal orientation (e.g., 100) is prepared by slicing and polishing a p-type silicon boule grown in the presence of a p-type dopant such as boron following conventional crystal growth techniques. Other p-type dopants for silicon include aluminum, gallium, and indium.

As discussed hereinabove, the field oxide isolation can be fabricated by any of several known procedures including thermal oxidation of the semiconductor substrate or by well known vacuum or chemical vapor deposition techniques. Furthermore, the field oxide may be formed above the semiconductive surface or it may be partially or fully recessed into the semiconductive substrate. An example of one such procedure is the fully recessed oxide isolation technique disclosed in U.S. Pat. No. 3,899,363, disclosure of which is incorporated herein by reference.

Figure 2:
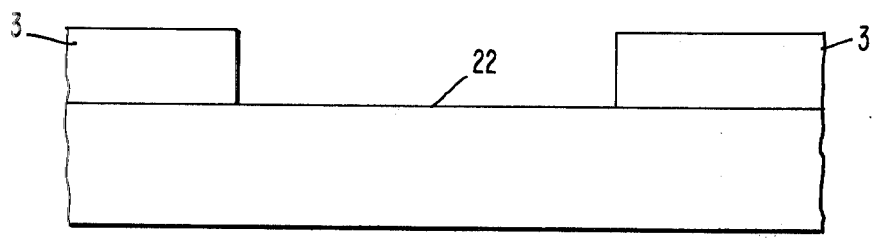

For the purpose of illustration of the procedure of the present invention, a nonrecessed field isolation oxide will be used. The field isolation regions are generally about 4,000 to about 10,000 angstroms thick. The field oxide regions 3 and the device regions 22 (see FIG. 2) are delineated by employing a lithographic mask. The mask is of a transparent material having opaque portions in a predetermined pattern. This is the first basic lithographic masking step.

A thin floating gate insulator layer of silicon dioxide 5 (see FIG. 3) is grown on or deposited onto the silicon substrate 2. This gate insulator, which is usually about 200 to 1,000 angstroms thick, can be formed by thermal oxidation of the silicon surface at 1000° C. in the presence of dry oxygen.

A layer of polycrystalline silicon 6 (see FIG. 3) is then deposited. The polysilicon layer is approximately 1500 to 5000 angstroms thick, and may be formed by chemical-vapor deposition. The polysilicon layer is now doped with an n-type dopant such as arsenic, phosphorus, or antimony by one of several conventional techniques. Preferably, the polysilicon is doped with phosphorus and preferably uses the technique of depositing a $POCl_3$ layer at about 870° C. and then heating it to approximately 1000° C. to drive the phosphorus into the polysilicon making it n-type. After this, the residual of the $POCl_3$ layer is removed by etching the wafer in buffered hydrofluoric acid. This layer of polycrystalline silicon 6 is to be subsequently delineated to form the floating gate.

A relatively thin control gate insulator layer of silicon dioxide 7 (see FIG. 3) is grown on or deposited onto the polysilicon layer 6. This gate insulator, which is usually about 200 to about 2000 angstroms thick can be formed by thermal oxidation of the polysilicon surface 6 at 1000° C. in the presence of dry oxygen.

Next a second and subsequent layer of polycrystalline silicon 8 (see FIG. 3) is deposited. This layer 8 is to be subsequently delineated to form the control gate. The polysilicon layer is approximately 1500 to 5000 angstroms thick, and may be formed by chemical-vapor deposition. The polysilicon layer is now doped with an n-type dopant such as arsenic, phosphorus, or antimony by one of several conventional techniques. Preferably, the polysilicon is doped with phosphorus and preferably uses the technique of depositing a $POCl_3$ layer at about 870° C. and then heating it to approximately 1000° C. to drive the phosphorus into the polysilicon making it n-type. After this, the residual of the $POCl_3$ layer is removed by etching the wafer in buffered hydrofluoric acid. A thin surface protection layer of silicon dioxide 9 (see FIG. 3) about 50 to 200 angstroms thick is grown on or deposited onto the polysilicon layer to prevent a subsequently deposited etch barrier layer 10 from reacting with the polysilicon and thereby rendering it difficult to later remove the etch barrier layer.

Figure 3:
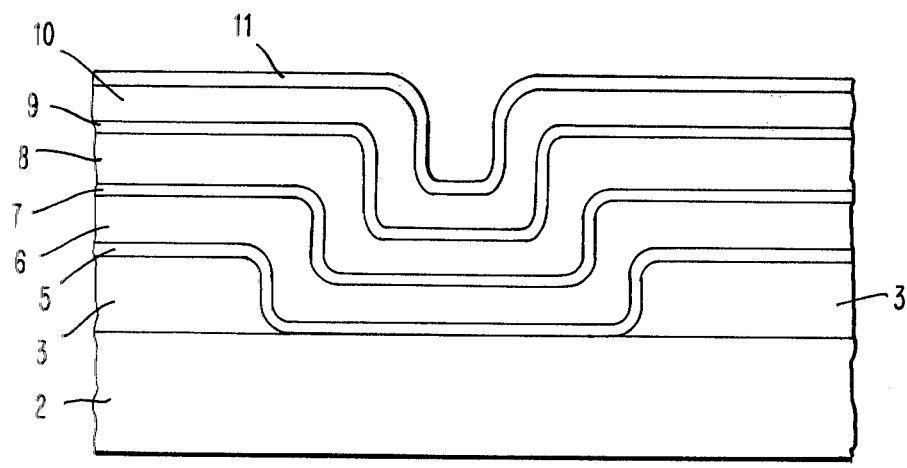

An adherent etch barrier layer 10 (see FIG. 3) of a material such as silicon nitride, aluminum nitride, boron nitride, aluminum oxide, or silicon carbide is then deposited. Preferably the layer 10 is of silicon nitride and is approximately 500 to 1000 angstroms thick. The layer 10 may be deposited by conventional chemical-vapor deposition techniques. An additional layer of silicon dioxide 11 is then deposited. The silicon dioxide layer 11 is approximately 500 to 1000 angstroms thick and may be formed by chemical-vapor deposition. This layer serves as an etching mask to delineate the layer 10. The resultant structure is shown in FIG. 3. The device is then annealed at about 1000° C. for about 5 minutes. The layer 10 serves as an etching mask to delineate the gate pattern.

A gate pattern determining layer such as a layer of resist material (not shown) of the type employed in known lithographic masking and etching techniques is placed over the surface of the upper oxide layer 11. Any of the well known photosensitive polymerizable resist materials known in the art may be used. The resist material is applied as by spinning on or by spraying.

The layer of photoresist material (not shown) is dried and then selectively exposed to ultraviolet radiation through a photolithographic mask. This mask is of a transparent material having opaque portions in a predetermined pattern. The masked wafer is subjected to ultraviolet light, polymerizing the portions of the resist material underlying the transparent regions of the mask. After removing the mask, the wafer is rinsed in a suitable developing solution which washes away the portions of the resist material which were under the opaque regions of the mask and thus not exposed to the ultraviolet light. The assembly may then be baked to further polymerize and harden the remaining resist material which conforms to the desired pattern, i.e., it covers the regions in which the polysilicon gate regions will subsequently be formed.

Next the structure is treated to remove the portions of the silicon dioxide 11 not protected by the resist material. The wafer is immersed in a solution of buffered hydrofluoric acid. The etching solution dissolves silicon dioxide but does not attack the resist, etch barrier layer 10 such as silicon nitride, or other materials of the assembly.

The photoresist material above the etched silicon dioxide 11 is then removed by dissolving in a suitable solvent. The remaining silicon dioxide regions 11 conform to a predetermined pattern, and now serve as a mask for etching predetermined patterns in the etch barrier layer 10. Layer 10 then serves as a mask for etching patterns in the thin oxide layer 9, as well as in the polysilicon layer 8 in the thin oxide layer 7 and in the polysilicon layer 6.

Figure 4:
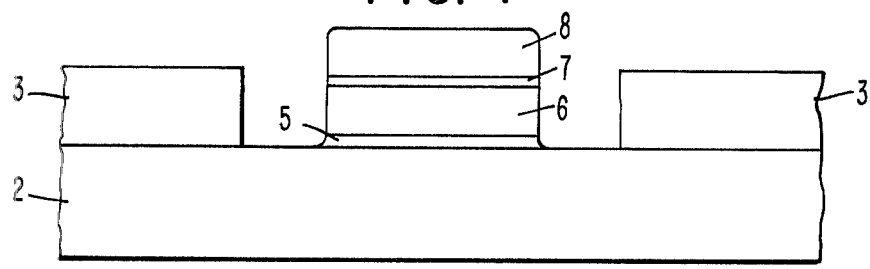
Figure 7:
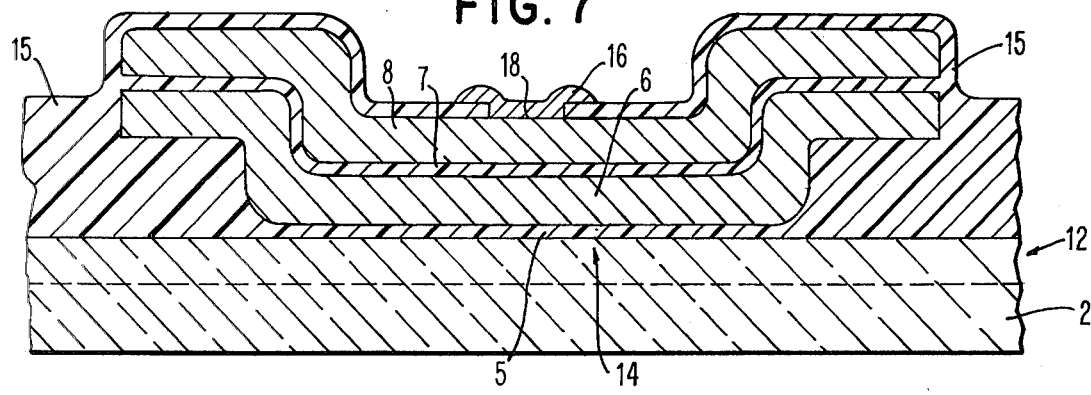
FIG. 7 is a cross-sectional view of FIG. 6 along the length direction in the direction of the arrows 7—7.

Patterns in the layer 10 when silicon nitride is employed, can be formed by etching in a phosphoric acid solution at 180° C. Patterns in the thin oxide layer 9 are formed along with removal of the remaining portions of oxide layer 11 by etching in a solution of buffered hydrofluoric acid. Patterns in the second polysilicon layer 8 are formed by etching in a well known etchant such as ethylene diamine pyrocatechol at 100° C. Patterns in the thin oxide layer 7 are formed by etching in a solution of buffered hydrofluoric acid. Patterns in the first polysilicon layer 6 are formed by etching in a well known etchant such as ethylene diamine pyrocatechol at 100° C. Next the remaining portions of layer 10 are removed. When silicon nitride is employed, the removal can be formed by etching in a phosphoric acid solution at about 180° C. This completes the second basic lithographic masking step which delineates both the control gate and floating gate. Since the control and floating gates are delineated using the same lithographic mask, they are self-aligned with each other in all lateral dimensions (see FIGS. 4 and 7).

The n-type source and drain regions are now formed by well-known ion implantation or diffusion techniques. For purposes of illustrating the present invention, thermal diffusion has been selected. For instance, the n-type source and drain regions 12 and 13, respectively, (see FIG. 5) can be formed by depositing a $POCl_3$ layer at a gas phase concentration of about 5500 ppm at approximately 870° C. and then heating at about 1000° C. to drive the phosphorus into the silicon substrate 2. During thermal diffusion, the polysilicon gates 6 and 8 and the silicon-dioxide layers 7 and 9 act as a blocking mask to prevent n-type dopant impurities from entering the FET channel region 14 under the polysilicon gates 6 and 8. The thick field oxide 3 acts as a blocking mask to prevent n-type impurities from entering the field isolation regions.

Figure 5:
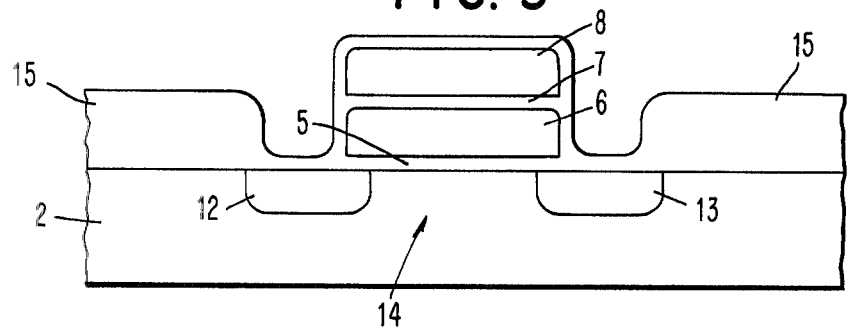

The boundaries between the n-type source and drain regions and the channel of the FET are determined by the polysilicon gates 6 and 8 (see FIG. 5). With both gates self-aligned to the source and drain, the parasitic gate to source and drain overlap capacitances are advantageously reduced over other FET fabrication techniques.

Next, a dielectric insulation layer 15 is formed above the polysilicon gate 8 and above the n-type source and drain regions, 12 and 13, respectively, not covered by the polysilicon gates. Formation of layer 15 also increases the thickness of the field oxide 3. Layer 15 electrically insulates the subsequently formed conductive line to the control gate from the n-type source and drain regions. Layer 15 also decreases the capacitive coupling between the metallic interconnection line and the source, drain and substrate. Accordingly, layer 15 should be as thick as possible, but not so thick as to cause degradation of or discontinuities in the conductive lines to any undesired extent.

The dielectric insulation 15 over the control gate 8 and n-type source and drain regions 12 and 13 is formed by growing a silicon dioxide layer 1500 to 5000 angstroms thick by thermal oxidation at 800°–1100° C. in the presence of oxygen. During this oxidation, about 600 to 2000 angstroms of the 3500 angstroms thick polysilicon plate is converted to silicon dioxide, and about 600 to 2000 angstroms of the silicon substrate over the n-type source and drain regions is also converted to silicon dioxide. The n-type source and drain regions 12 and 13 are drawn down into the substrate and laterally around the growing oxide. Since the oxide tends to expel n-type dopants, the n-type dopant is not consumed to any significant extent during this oxidation. The sides of the gates 6 and 8 are subjected to the oxidation, which desirably provides protective insulation. During oxidation, the thickness of the field oxide 3 is advantageously increased by about 500 to 1500 angstroms.

Also, if desired at this time, the device can be annealed, for instance, by heating to about 500° C. for about 30 minutes.

In fabricating FET integrated circuits, it is necessary to connect conductive lines to the control gate 8 and to n-type source and drain regions. This is done by applying a photoresist layer to the assembly. The resist material is exposed with UV radiation using a predetermined lithographic mask pattern and the unexposed regions of the resist are dissolved away. This is the third basic lithographic masking step. Next, the structure is treated to remove the portions of the silicon dioxide not protected by the resist material. The wafer is immersed in a solution of buffered hydrofluoric acid to provide contact holes or vias 17 and 18 (see FIG. 6) through the oxide insulation layer 15 to allow electrical connection to the polysilicon control gate 8 and to n-type source and drain regions 12 and 13. The remaining photoresist above the etched silicon dioxide is then removed by dissolving in a suitable solvent. Now the polysilicon control gate 8, and the n-type source and drain regions in the contact holes, have been revealed for contacting.

Figure 6:
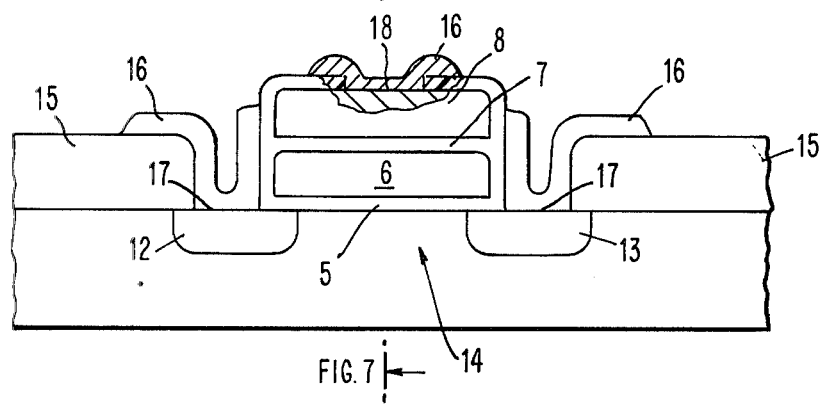

Next, the metallic-type highly-conductive interconnection line material 16, preferably a metal, is deposited and the interconnection pattern is delineated (see FIG. 6). An example of a highly-conductive material commonly used for interconnections is aluminum which may contain relatively small amounts of impurities introduced to decrease electromigration effects or to prevent or reduce chemical reactions between the aluminum and the semiconductive material to be contacted. The highly-conductive material such as aluminum may be deposited by sputtering or preferably by evaporation.

It is noted that a barrier layer (not shown) may be placed between the aluminum and the silicon or polysilicon semiconductive material to prevent or reduce chemical reaction between the aluminum and the semiconductive material. The barrier layer may be of a metal such as titanium or chromium, or of an intermetallic silicide such as platinum silicide or paladium silicide.

Next, a photoresist layer is applied to the assembly. The resist material is exposed with UV radiation using a predetermined mask pattern, and the unexposed regions of the resist are dissolved away. This is the fourth basic lithographic masking step. Then the structure is treated to remove the portions of the conductive material not protected by the resist as illustrated in FIG. 6. Also, as known in the art, further layers (not shown) may be provided over the metallic-type layer 16 such as sputtered silicon dioxide for the purpose of passivating the integrated circuit. Furthermore, as is known in the art, when desired, other masking steps may be used to provide vias through the passivation layer in order to make contact to the metallic interconnection layer or to the semiconductive substrate. Also, when desired, electrical connection to the back surface of the semiconductive substrate can be made. For instance, oxide on the back surface could be etched followed by depositing a metallic-type material such as aluminum. The device can then be annealed if desired such as by heating at 400° C. for about 20 minutes in an atmosphere of about 10% $H_2$ and 90% $N_2$.

What is claimed is:

1. In a method for fabricating an integrated circuit containing an array of FETs and the associated, addressing, decoding and sensing circuits wherein individual FETs of the array include a floating gate and a control gate in a stacked relationship with each other and having electrical insulator between the floating and control gates which comprises:
    A. delineating predetermined insulating regions above or recessed into the substrate to provide isolating field regions between FETs of the array;
    B. then delineating a first layer of gate-forming material employing the same lithographic mask to provide a floating gate and a control gate which are self-aligned with each other in all lateral directions, and to provide etched regions which are to be subsequently doped for forming source and drain regions self-aligned in the length dimensions with respect to both of said floating and control gates;
    C. then thermally diffusing or ion-implanting active impurities into predetermined regions of the semiconductive substrate beneath the etched regions to provide source and drain regions which are self-aligned with respect to said floating and control gates;
    D. then providing insulating layer;
    E. then delineating contact holes to source and drain regions; and F. then delineating a metallic-type high-conductivity electrical interconnection pattern that makes electrical connection to the control gates in the array of FETs and to FET sources and drains.

2. The method of claim 1 wherein both said floating and said control gates are polycrystalline silicon doped with the same type impurities and are both delineated using the same etchant.

3. The method of claim 1 wherein said floating gate is selected from the group of polycrystalline silicon, refractory metal, and refractory metal silicide and said control gate is selected from the group of polycrystalline silicon and refractory metal silicide.

4. The method of claim 1 wherein said floating gate and said control gate are doped polycrystalline silicon.

5. The method of claim 3 wherein said refractory metal is selected from the group of tungsten, tantalum, hafnium, and rhodium.

6. The method of claim 1 wherein the interconnection material is a metal.

7. The method of claim 6 wherein said metal is aluminum.

8. The method of claim 1 or 2 wherein delineation of the floating and control gates includes:

A. providing a first insulator for a floating gate to be subsequently defined;
B. depositing and doping a first layer of gate-forming material above the first insulator;
C. providing a second and subsequent insulator above said first layer of gate-forming material above the first insulator;
D. providing a second and subsequent insulator above said first layer of gate-forming material for a control gate to be subsequently delineated;
E. then depositing and doping a second and subsequent layer of gate forming material above said subsequent insulator;
F. providing a surface protection layer of silicon dioxide onto said subsequent layer of gate-forming material; and
G. providing an adherent etch barrier layer on said silicon dioxide.

9. The method of claim 8 wherein said etch barrier layer is selected from the group of silicon nitride, aluminum nitride, boron nitride, aluminum oxide, or silicon carbide.

10. The method of claim 8 wherein said etch barrier layer is silicon nitride.